United States Patent [19]

Saari

[11] 4,375,619

[45] Mar. 1, 1983

[54] FET OPERATIONAL AMPLIFIER WITH INCREASED OUTPUT SWING

[75] Inventor: Veikko R. Saari, Spring Lake Heights, N.J.

[73] Assignee: Bell Telephone Laboratories, Incorporated, Murray Hill, N.J.

[21] Appl. No.: 163,186

[22] Filed: Jun. 26, 1980

[51] Int. Cl.³ .............................................. H03F 3/45
[52] U.S. Cl. ................................... 330/253; 330/255; 330/260
[58] Field of Search ................ 330/253, 255, 260, 264

[56] References Cited

U.S. PATENT DOCUMENTS 4,038,607 7/1977 Schade, Jr. ........................... 330/264
4,284,957 8/1981 Haque .................................. 330/253

Primary Examiner—James B. Mullins
Attorney, Agent, or Firm—Volker R. Ulbrich; Jacobs et al., "Touch-Tone Decoder Chip Mates Analog Filters with Digital Logic", *Electronics*, Feb. 15, 1979, pp. 105–112.

[57] ABSTRACT

A differential input stage is connected to a push-pull output stage with a complementary MOS output pair (30, 32) in a common-source configuration. The gates of the output transistors (30, 32) are each driven by the output of one of a pair of auxiliary transistors (38, 42) which have their gates coupled to the signal. A separate bias current source (41, 44) is connected between the output of each of the auxiliary transistors and a supply node (26). The bias current sources (41, 44) draw current in proportion to the ratio of the transconductances of the auxiliary drive transistors (42, 38) for establishing the voltage across a coupling resistor (36) connecting the output transistor (30, 32) gates and thereby determining the crossover current of the output stage (50). Also disclosed is a frequency response compensation network circuit section (74) which is phase-inverting and provides a local negative feedback loop for the tandem arrangement of intermediate stage (48) and the output stage (50).

5 Claims, 3 Drawing Figures

10

40

FET OPERATIONAL AMPLIFIER WITH INCREASED OUTPUT SWING

TECHNICAL FIELD

The present invention relates to operational amplifiers which are for integrated circuits, particularly those which utilize FETs (Field-Effect Transistors) for at least the output transistors.

BACKGROUND OF THE INVENTION

A complex integrated system typically contains a large number of operational amplifiers on a single chip for performing various electronic operations. FETs, such as MOSFETs (Metal-Oxide on Semiconductor Field-Effect Transistors) have certain favorable characteristics for use in such operational amplifiers. They can be fabricated with a minimum of processing steps, they are small, they dissipate very little power, and they present a very high input impedance. One example of an MOS operational amplifier is a CMOS (Complementary MOS) arrangement described by G. M. Jacobs et al. in "TOUCH-TONE Decoder Chip Mates Analog Filters with Digital Logic", *Electronics*, page 112, FIG. 7, Feb. 15, 1979.

There are, on the other hand, also certain unfavorable characteristics of MOSFETs. For one thing, the electrical characteristics of MOSFETs generally vary considerably from chip to chip. The effects of this can usually be remedied by increasing the complexity of the circuit. A major persisting problem for MOSFET operational amplifiers, however, is that MOSFET devices have a relatively low transconductance. Therefore, when it is required to drive a low impedance load, as is frequently the case, it is often ncessary to provide the operational amplifier with bipolar output transistors in order to increase the output capability. Such bipolar transistors require processing steps additional to those which would be required for an integrated circuit with MOSFET devices alone, and therefore add significantly to the cost of the entire device. Hence there is a need for an operational amplifier which has a large gain, or transconductance, but nevertheless uses MOSFET output transistors.

SUMMARY OF THE INVENTION

The novel operational amplifier in accordance with the present invention has a complementary pair of MOS output transistors, each connected in the common-source configuration, with their gates coupled together for biasing purposes by a transistor acting substantially as a resistor. At least one of the output transistors has its gate drive accentuated by an auxiliary drive transistor which, in turn, has its own gate coupled to the signal from the input stage, its source connected to a power supply voltage, and its drain connected to the gate of the driven output transistor. There is additionally provided a bias current source which is connected between a power supply voltage and the drain of the auxiliary transistor. The auxiliary transistor(s), together with its (their) bias current source(s), constitute the middle stage in tandem with the output stage of the amplifier. This arrangement permits the gate(s) of the output transistor(s) to be driven over substantially the whole voltage range between the supply voltages of the amplifier and in conjunction with the coupling resistor also affords a well-controlled and low crossover current. The roll-off of the frequency response is controlled by a compensation network section which includes a phase inverter and provides a local negative feedback loop encompassing the middle and output stages. Connecting the compensation network section directly to the output terminal of the amplifier lowers the output impedance and makes the stability margins less dependent on the load capacitance.

DETAILED DESCRIPTION

The circuits of the preferred embodiments described below are realized with CMOS technology. Conventional symbols for MOS devices are used, and each such device has associated with it the marking "S" as a convenience in determining which of the terminals is functioning as the source.

The expression "common-source configuration" as used herein describes the manner in which the transistors of an amplifier stage are connected, and means that the source terminal of the transistor is connected to a fixed voltage, while the gate and drain voltages vary with the signal voltage.

EXAMPLE I

Figure 1:
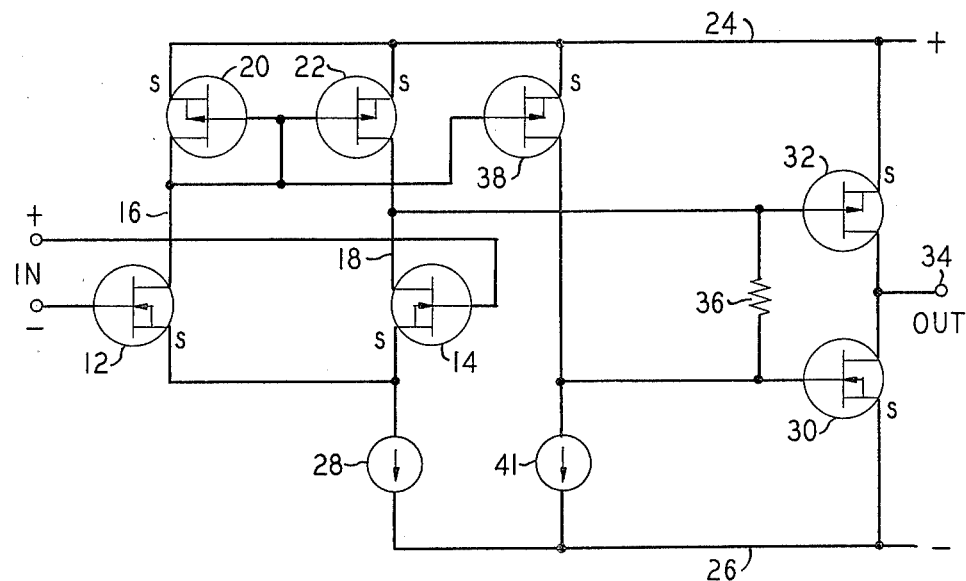
FIG. 1 is a greatly simplified schematic circuit diagram of an operational amplifier in accordance with one preferred embodiment of the present invention.

One example of an amplifier in accordance with a preferred embodiment of the present invention is shown in FIG. 1 of the drawings in a simplified schematic which does not show in detail such features as biasing or compensation network sections. These sections can have various different configurations well known to those in the art of integrated circuit design.

The amplifier 10 of FIG. 1 has an input stage with a complementary differential pair of N-channel transistors 12, 14 and output nodes 16, 18, respectively. A further complementary pair of P-channel load transistors 20, 22 in a current mirror configuration are connected between the output nodes 16, 18 and a positive power supply node 24. The sources of the differential input transistors 12, 14 are connected to a negative power supply node 26 through a bias current network 28. Present technology permits the option of connecting the bulk material of the N-channel input transistors 12 and 14 to either the node at which the sources of these transistors are joined or to the negative supply.

The output stage of the amplifier 10 includes a CMOS pair of pull-down and push-up output transistors 30, 32, respectively, connected in series between the power supply nodes 24, 26 in a common-source configuration with their drains connected together and to an amplifier output terminal 34. The gates of the output transistors 30, 32 resistor 36. The gate of the P-channel push-up transistor 32 is connected to the output node 18 of the input stage. The gate of the N-channel pull-down transistor 30, on the other hand, is connected to the drain of a P-channel auxiliary gate driving transistor 38 which has its source connected to the positive supply node 24 and its gate connected to the other output node 16 of the input stage. A bias current network 41 is connected between the drain of the auxiliary gate driving transistor 38 and the negative supply node 26.

The value of the resistor 36 connecting the gates of the output transistors 30, 32 is chosen so that in the quiescent state the current through the resistor 36 provide the desired voltage difference between the gates of the output transistors 30, 32 to result in an optimum crossover current for the amplifier 10. This current is determined by the imbalance designed into the bias current value of the input transistor 14 and its load transistor 22 and the similar imbalance between the auxiliary transistor 38 and its associated current-source 41.

In describing the operation of the amplifier 10, it is convenient to assume that the noninverting "+" input terminal of the one input transistor 14 is tied to ground potential and the inverting "−" input terminal of the other input transistor 12 receives the signal input.

When the input signal at the "−" input terminal rises from ground potential, the current in input transistor 12 is increased, and the current in the other input transistor 14 is reduced, because the current in biasing network 28 is substantially constant. The increased transistor 12 current implies an increase in the current of transistor 20 and also in the current mirroring transistors 22 and 38. The imbalances which tend to result between the currents being fed to the high-impedance nodes, which are also the gate nodes of output transistors 32 and 30, by the transistors 22 and 38, respectively, and the currents being drawn away from these nodes by transistor 14 and bias current source 41, respectively, must be erased by voltage shifts. The voltages at the high-impedance nodes shift upward, thereby reducing the currents being fed into these high-impedance nodes and increasing the currents being withdrawn, until a balanced state is reestablished. The mechanism for these influences of the voltages of the high-impedance nodes on the currents impinging upon these nodes is the relatively weak dependence of the current of a transistor on the corresponding drain-to-source voltage. There is only an almost negligible change in the current of resistance element 36. The end result of the voltage rising at the high-impedance nodes is that the current in the N-channel output transistor 30 is increased and the current in the P-channel output transistor 32 is reduced. Both of these actions tend to reduce the output current; hence the output voltage falls, assuming that the load placed on the output node is a passive one.

In the quiescent, or "crossover" condition of the amplifier 10, when the gate of the differential input transistor 12 is also at ground potential, there is, as explained above, a current through the resistor 36 to provide a separation of the bias voltages on the gates of the pull-down transistor 30 and the push-up transistor 32. This reduces the quiescent absolute values of the gate-to-source voltages of the output transistors 30, 32, which voltages would otherwise sum up to the total supply voltage if the gates were shorted together or would be practically uncontrolled if the branch represented by resistor 36 were omitted (that is, opened). Hence, the current in the output transistors in this null output state, the crossover current, is set at some chosen, relatively low level. It is clear that even with a desired low crossover current value, the output devices can be made to have a large transconductance. This enhances the load-driving capability of the amplifier without entailing a penalty in quiescent power dissipation.

When the signal voltage at the gate of the input transistor 12 steps down from the ground potential, the voltages of the high impedance nodes 18 drop to drive down the gate voltages of the output transistors 32 and 30 and hence drive up the voltage of the output terminal 34 to give the appropriate inverted output. Thus, it is seen that the action of the amplifier 10 is in a sense largely symmetrical, with the auxiliary drive transistor 38 providing extra gain through the signal path that includes output transistor 30. This signal path is capable of driving the gate of transistor 30 to within a fraction of a volt of either supply voltage. The other signal path is not capable of driving either high-impedance node much below the voltage level at the noninverting "+" input terminal.

With the circuit of the amplifier 10 of FIG. 1, the coupling resistor 36 connecting the gates of the output transistors 30, 32 acts as a voltage source dependent on the primary bias current in the amplifier 10. This voltage assures the desired crossover current magnitude and stability for a given set of supply voltages having moderately tight tolerances. The drive voltage ranges of the gates of the output transistors 30, 32 can actually overlap considerably, the drain of transistor 38 being capable of reaching to within a transistor turn-on threshold voltage of the voltage of the supply node 24. Such a wide range in the driving voltage results in a more effective use of the output transistor 30, so that for a given low impedance load the output transistors can be made smaller than otherwise possible.

EXAMPLE II

Figure 2:
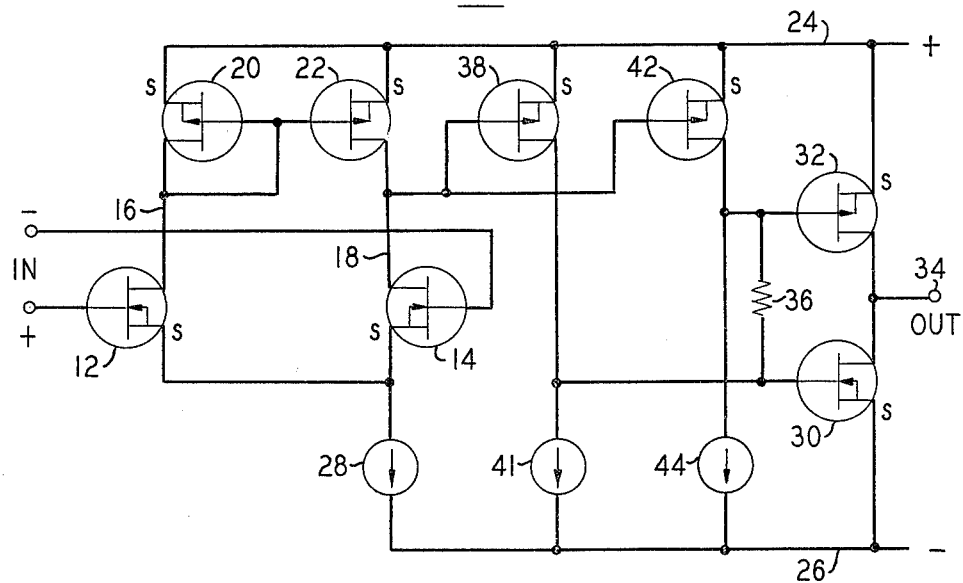
FIG. 2 is a schematic circuit diagram illustrating an operational amplifier in accordance with another embodiment of the present invention.

In FIG. 2 of the drawings there is shown in a simplified schematic form an amplifier 40 in accordance with another preferred embodiment of the present invention. Elements of this amplifier 40 which correspond to similar elements of the amplifier 10 of FIG. 1 are given the same reference numerals.

The input and output stages of the amplifier 40 are similar to those of the amplifier 10 of FIG. 1. A single output node 18 of the input stage is connected to the gates of both the first and second auxiliary drive transistors 38, 42. The auxiliary drive transistor 38 corresponds to the auxiliary drive transistor 38 of the amplifier 10 of FIG. 1, but has its gate connected to the other output node 18 of the input stage. The auxiliary drive transistor 42 has its source tied to the positive supply node 24 and its drain tied to the gate of the push-up output transistor 32. A third bias current source 44 is connected between the negative supply node 26 and the gate of the push-up transistor 32. The bias current sources 41, 44 and the auxiliary drive transistors 38, 42 are designed so that the ratio of the current sources 41 and 44 is the same as the ratio of the transconductances of auxiliary drive transistors 42 and 38, respectively. This results in a bias current surplus being driven into the top end of resistor 36 and exactly the same current being drawn out of the bottom terminal of resistor 36. The value of resistor 36 is chosen so that a given desired voltage drop occurs across it.

Figure 3:
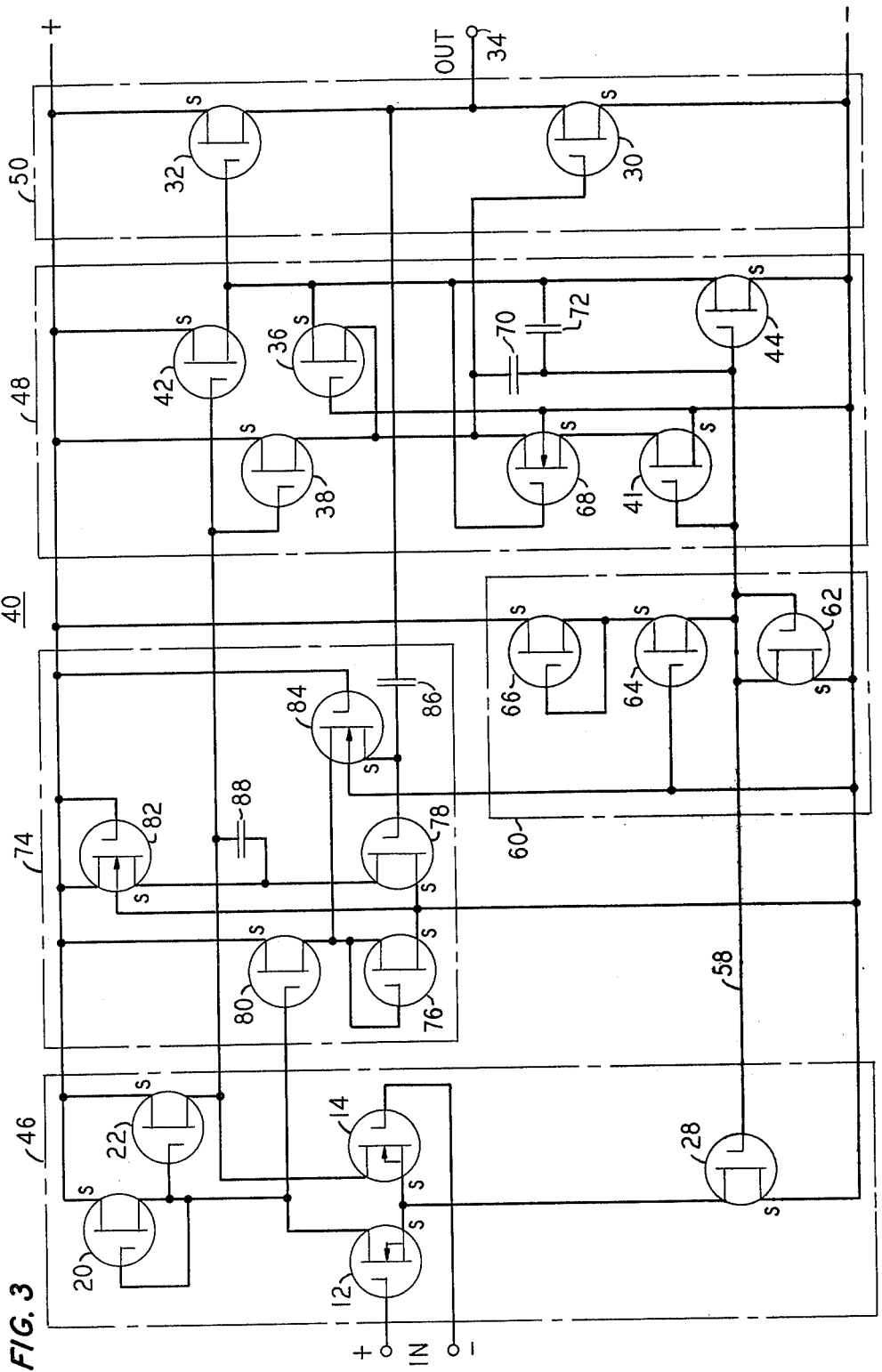
FIG. 3 is a more detailed schematic circuit diagram of the operational amplifier of FIG. 2 showing additional circuit features which particularly adapt the amplifier for certain desired frequency response roll-off characteristics.

FIG. 3 shows a preferred form of the amplifier 40 of FIG. 2 in detail with specific examples of bias network and compensation circuits. Elements of the amplifier of FIG. 3 which correspond to elements of the amplifier 40 of FIG. 2 have like reference numerals. The circuit of the amplifier 40 can be considered to be an assembly of stages and sections. These have been outlined by broken lines. An input stage 46 with elements as discussed above has its output node 18 connected to the two auxiliary drive transistors 38, 42 which, along with biasing and gain/frequency shaping elements, represent an intermediate stage 48. These auxiliary drive transistors 38, 42, in turn, are connected to the gates of the two output transistors 30, 32 which make up the output stage 50. It may be seen that while in the drawing of FIG. 3 these elements appear somewhat displaced from their relative locations in the simplified circuit of FIG. 2, nevertheless, they are connected in the same fashion. The transistor bias current sources 28, 41, 44 are in the form of the bias current transistors 28, 41, 44, respectively. The bias control voltage for these bias current transistors 28, 41, 44 is a voltage on a bias node 58 which is determined by a biasing section 60 serving the entire circuit of the amplifier 40. The biasing section 60 includes the three passively connected transistors 62, 64, 66. In series with the bias current transistor 41 is an admittance limiter transistor 68 which has its gate connected to the drain of the auxiliary drive transistor 42 to prevent the load impedance of transistor 38 from falling too low under dynamic conditions. The drains of the auxiliary transistors 38, 42 are connected to the bias voltage node 58 via a capacitor 70 and a capacitor 72, respectively. These capacitors 70, 72 have the function of rolling off the gain of the intermediate stage 48 at frequencies below the upper band limit of the amplifier 40, thereby assisting in the realization of adequate stability margins. The gate coupling resistor 36 is in the form of a transistor which has its gate tied to the negative supply node 26. The resistances of transistors 36 and 64 remain in a relatively constant ratio over a wide spread of manufacturing lots. This maintains good control of the voltage drop produced by resistor 36.

The amplifier 40 is also provided with a compensation section 74 for controlling the roll-off of the gain of amplifier 40 as the frequency of the signal rises. The compensation section 74 includes an inverter stage consisting of transistors 78 and 82 associated with a pair of biasing transistors 76, 80, an ac (alternating current) blocking transistor 84, and two coupling capacitors 86, 88. The capacitor 86 transmits the ac component of the signal from the output terminal 34 to the gate of transistor 78, with FET resistor 84 determining the cutoff frequency of this unity transfer ratio. The capacitor 88 applies internal feedback to the output node 18 of the input stage 46, and the value of its capacitance determines the position of the inverse frequency asymptote produced in the "open-loop" gain characteristic of amplifier 40. The functioning of a compensation network, such as section 68, is readily understood by those of ordinary skill in the art of integrated circuit operational amplifier design and is not discussed in more detail here.

Prior compensation networks were connected across an inverting block of the amplifier and did not include elements which provide an internal inversion. With the novel compensation network, which includes an inverter formed by the transistors 78, 84, the network can be connected across the non-inverting block which includes the output terminal. This results in a lower output impedance and in stability margins which are not so dependent on the load capacitance. The use of such a compensation network is not limited to the particular amplifiers described herein. It can be used advantageously in other feedback amplifiers having at least three stages. For a four stage amplifier, for example, the network can be connected between the input to the second stage and the output of the third stage, or between the input of the third stage and the output of the fourth stage. In either case, it provides a negative local feedback loop for the compensated block.

The circuits of the preferred embodiments described above are all realized with complementary CMOS technology. However, they can also be realized with other types of field effect devices and bipolar devices. The adaptation of the circuits for such other types of devices requires considerations which are known to those of ordinary skill in the art of integrated circuit design.

No specific values are given here for the various elements of the circuits of the preferred embodiments. Such values depend upon the particular application for which the circuit is intended, and therefore would be determined in each instance by the designer making use of such a circuit. The techniques for determining such values are well known and do not require extensive experimentation.

I claim:

1. An operational amplifier having first and second power supply nodes for supplying power to first and second stages, said first stage having first and second output nodes coupled to said second stage, said second stage comprising a complementary pair of first and second field effect transistors connected in series between said supply nodes with their drain terminals connected together at an output node of said second stage and their gates connected together through a first resistor, said amplifier being characterized by:
   a third transistor having its gate connected to one of said output nodes, its source connected to said first power supply node, and its drain connected to the gate of said first transistor;
   a bias current means connected between said gate of said first transistor and said second power supply node, and
   a fourth transistor having its gate connected to said second output node, its source connected to said first power supply node, and its drain connected to the gate of said second transistor.

2. The amplifier according to claim 1 and comprising a second bias current means connected between said gate of said second transistor and said second power supply node.

3. The amplifier according to claim 2 wherein said first bias current means has a current which is higher than the current of said second bias current means in proportion to the ratio of the transconductance of said fourth transistor to the transconductance of said third transistor.

4. The amplifier according to claim 1 comprising:
   two stages connected in tandem, with the output of one being connected to the input of the other and forming together a non-phase-inverting section of said amplifier, and
   a phase-inverting frequency response compensation network section providing local negative feedback for said non-phase-inverting section, said compensation network including a first coupling capacitor connected to an output node of one of said tandem stages and further including a second coupling capacitor connected to an input node of the other of said tandem stages.

5. The amplifier according to claim 4, wherein one side of said compensation network section is connected to said output terminal.

* * * * *